United States Patent
Kim et al.

(10) Patent No.: US 10,147,746 B2
(45) Date of Patent: Dec. 4, 2018

(54) FLEXIBLE DISPLAY DEVICE AND METHOD OF MANUFACTURING THE SAME

(71) Applicants: Samsung Display Co., Ltd., Yongin-Si, Gyeonggi-Do (KR); Industry-Academic Cooperation Foundation, Yonsei University, Seoul (KR)

(72) Inventors: Kihyun Kim, Daegu (KR); Taewoong Kim, Yongin-si (KR); Jong-hyun Ahn, Suwon-si (KR); Wonho Lee, Seoul (KR); Minwoo Choi, Suwon-si (KR)

(73) Assignees: SAMSUNG DISPLAY CO., LTD., Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/925,955

(22) Filed: Mar. 20, 2018

(65) Prior Publication Data
US 2018/0211977 A1    Jul. 26, 2018

Related U.S. Application Data

(62) Division of application No. 14/982,213, filed on Dec. 29, 2015, now Pat. No. 9,960,192.

(30) Foreign Application Priority Data

Apr. 6, 2015    (KR) .................. 10-2015-0048540

(51) Int. Cl.
| | | |
|---|---|---|
| *H01L 27/14* | (2006.01) | |
| *H01L 27/15* | (2006.01) | |
| *H01L 27/12* | (2006.01) | |

(52) U.S. Cl.
CPC ........ *H01L 27/124* (2013.01); *H01L 27/1218* (2013.01); *H01L 27/1259* (2013.01)

(58) Field of Classification Search
CPC  H01L 27/124; H01L 27/1218; H01L 27/1259
(Continued)

(56) References Cited

U.S. PATENT DOCUMENTS

| | | |
|---|---|---|
| 6,371,637 B1 | 4/2002 | Atchinson et al. |
| 8,779,694 B1 | 7/2014 | Lindblad et al. |

(Continued)

FOREIGN PATENT DOCUMENTS

| | | |
|---|---|---|
| KR | 1020050075280 A | 7/2005 |
| KR | 101290003 B1 | 7/2013 |

(Continued)

OTHER PUBLICATIONS

Choi et al., "All inorganic based active matrix light emitting diode display on unusual substrate", School of Electrical and Electronic Engineering, Yonsei University, Seoul, 2015, pp. 1-9.

*Primary Examiner* — Dzung Tran
(74) *Attorney, Agent, or Firm* — Cantor Colburn LLP

(57) ABSTRACT

A flexible display device includes a flexible substrate, an adhesion layer disposed on a surface of the flexible substrate, and a plurality of pixel structures in respective pixels on the adhesion layer. Each of the pixel structures on the adhesion layer includes a light emitting diode including an inorganic light emitting layer, and a thin film transistor which is connected to the light emitting diode and switches a state of the light emitting diode.

12 Claims, 9 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2002/0037605 A1 | 3/2002 | Ninomiya ........... | H01L 21/6835 438/125 |
| 2003/0162463 A1 | 8/2003 | Hayashi .............. | H01L 21/6835 445/24 |
| 2006/0240275 A1 | 10/2006 | Gadkaree .......... | H01L 21/76251 428/641 |
| 2006/0255336 A1 | 11/2006 | Kim .................... | H01L 51/0545 257/40 |
| 2007/0080420 A1 | 4/2007 | Kim ..................... | H01L 25/167 257/466 |
| 2007/0091062 A1 | 4/2007 | French .............. | G02F 1/133305 345/107 |
| 2009/0015760 A1 | 1/2009 | Hattori ................ | H01L 27/1266 349/93 |
| 2009/0104769 A1 | 4/2009 | Lee ..................... | H01L 23/3114 438/653 |
| 2011/0096134 A1* | 4/2011 | Kang ........................ | B41J 2/45 347/224 |
| 2014/0141547 A1 | 5/2014 | Kim ....................... | H01L 51/56 438/26 |
| 2014/0197727 A1 | 7/2014 | Qin | |

FOREIGN PATENT DOCUMENTS

| | | |
|---|---|---|
| KR | 1020110047769 A | 5/2014 |
| KR | 1020140063303 A | 5/2014 |

* cited by examiner

FLEXIBLE DISPLAY DEVICE AND METHOD OF MANUFACTURING THE SAME

This application is a divisional application of U.S. application Ser. No. 14/982,213 filed Dec. 29, 2015, claims priority to Korean Patent Application No. 10-2015-0048540 filed Apr. 6, 2015, and all the benefits accruing therefrom under 35 U.S.C. § 119, the entire contents of which are hereby incorporated by reference.

BACKGROUND

(1) Field

The invention relates to a flexible display device and a method of manufacturing the same, and more particularly, relates to a flexible display device having pixels in which light emitting diodes are disposed and a method of manufacturing the flexible display device having the pixels in which the light emitting diodes are disposed.

(2) Description of the Related Art

Successive to general flat-panel display devices, various forms of display devices have been developed. For example, these developed display devices include bendable, foldable, rollable and flexible display devices. Since the bendable, foldable, rollable and flexible display devices may be transformed into various forms in accordance with preset design or a user's requirements, image information may be used in increased applications and modes of image display.

SUMMARY

One or more exemplary embodiment of the invention provides a flexible display device including pixels defined therein, each of which includes a light emitting diode and a thin film transistor on a flexible substrate.

One more exemplary embodiments of the invention provides a method of manufacturing a flexible display device including pixels defined therein, each of which includes a light emitting diode and a thin film transistor on a flexible substrate.

In an exemplary embodiment, a flexible display device includes a flexible substrate, an adhesion layer disposed on a surface of the flexible substrate, and a plurality of pixel structures in respective pixels on the adhesion layer. Each of the pixel structures includes a light emitting diode including an inorganic light emitting layer, and a thin film transistor which is connected to the light emitting diode and switches a state of the light emitting diode.

In another embodiment, a method of manufacturing a flexible display device includes forming a thin film transistor on a first carrier substrate, forming a light emitting diode including an inorganic light emitting layer on a second carrier substrate, transferring the thin film transistor on the first carrier substrate, from the first carrier substrate to a surface of a flexible substrate, and transferring the light emitting diode on the second carrier substrate, from the second carrier substrate to the surface of the flexible substrate.

According to one or more exemplary embodiments of the invention, a transcription process may be used to respectively transfer a light emitting diode and a thin film transistor formed separately from each other using a relatively high temperature process, to a same surface of a flexible substrate, to simplify the manufacturing of a flexible display device including the thin film transistor and the light emitting diode. Therefore, manufacturing a flexible display device including a plurality of active matrix pixels on a flexible substrate may be improved since, since the flexible substrate is not exposed to the relatively high temperature process, hence accomplishing the flexibility of the flexible display device with relative ease.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
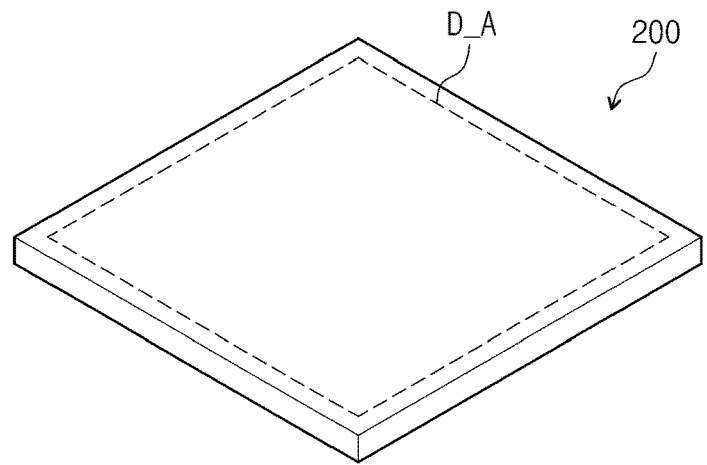
FIGS. 1A and 1B illustrate perspective views of an exemplary embodiment of a flexible display device according to the invention.

Now hereinafter will be described exemplary embodiments of the invention in conjunction with accompanying drawings. Advantages and features of the invention, and ways for accomplishing them will be apparent from exemplary embodiments described in detail hereinafter in conjunction with the accompanying drawings. The invention, however, may be embodied in various different forms, and should not be construed as being limited only to the illustrated exemplary embodiments. Rather, these exemplary embodiments are provided as examples so that this disclosure will be thorough and complete, and will fully convey the concept of the invention to those skilled in the art. The invention may be properly defined in the scope of the annexed claims. Unless otherwise noted, the same reference numerals denote the same elements throughout the attached drawings.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

When an element is referred to as being "on," or "over" another element or layer, there are no intervening element, or an intervening film, layer, area, or element present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
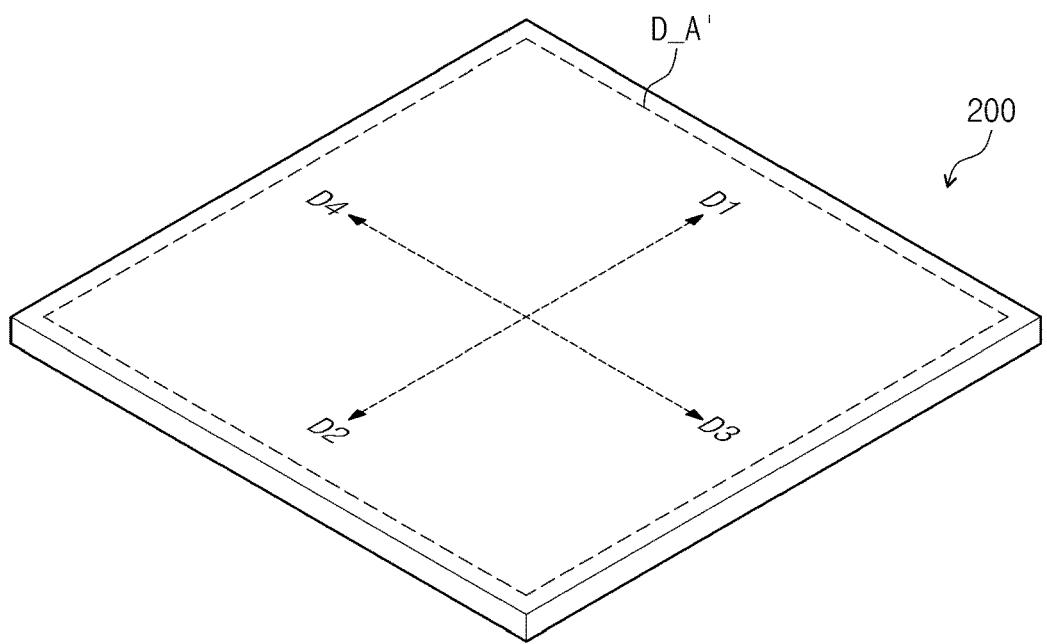

FIGS. 1A and 1B illustrate an exemplary embodiment of a flexible display device according to the invention.

Referring to FIGS. 1A and 1B, a flexible display device 200 may display an image at a display area D_A (indicated by a dotted line) thereof. A remaining display surface of the flexible display device 200 may be defined by a non-display area, for example, which surrounds the display area D_A. A total of the display surface of the flexible display device 200 may be defined by the display area D_A and the non-display area. The flexible display device 200 is flexible. In the exemplary embodiment, the flexible display device 200 may have flexibility and stretchability as including elements thereof disposed on a flexible substrate (FS of FIG. 2B) which is flexible and stretchable.

FIG. 1A illustrates an un-stretched state of the flexible display device 200. If the flexible display device 200 has stretchability, the flexible display device 200 may be extended along at least one extending direction within a plane thereof and may shrink along the reverse of the extending direction.

Referring to FIG. 1B, for example, external force is applied to the un-stretched state of the flexible display device 200 to cause a portion of the flexible device 200 to extend toward a first direction D1. If the external force is removed from the extended flexible display device 200, the portion of the flexible display device 200, which has been extended in the first direction D1, may shrink toward a second direction D2, which is the reverse of the first direction D1. The flexible display device 200 may have an enlarged display area D_A while the flexible display device 200 is extended in the first direction D1.

Additionally, external force is applied to the un-stretched state of the flexible display device 200 to cause another portion of the flexible device 200 to extend toward a third direction D3. If the external force is removed from the extended flexible display device 200, the portion of the flexible display device 200, which has been extended in the third direction D3, may shrink toward a fourth direction D4, which is the reverse of the third direction D3. The flexible display device 200 may have an enlarged display area D_A while the flexible display device 200 is extended in the third direction D3. While the extension of the flexible display device 200 is described with reference to single extension directions, the invention is not limited thereto.

Additionally, the flexible display device 200 may be extended in a plurality of directions. Referring again to FIG. 1B, for example, a force applied to the un-stretched state of the flexible display device 200 may extend the flexible display device 200 in each of the first to fourth directions D1, D2, D3 and D4. Accordingly, the flexible display device 200 may have an enlarged display area D_A' when the flexible display device 200 is in an extended (e.g., stretched) state thereof. As a result, the flexible display device 200 may provide an image which is initially displayed to a user through the non-enlarged display area D_A (FIG. 1A) as an enlarged image to the user through the enlarged display area D_A' (FIG. 1B). Conversely, the flexible display device 200 may provide the enlarged image of the enlarged display area D_A' (FIG. 1B) as the initial image to the user through the reduced display area D_A (FIG. 1A).

A plane of the flexible display device 200 may be defined by one of the first and second directions, and one of the third and fourth directions. That is, the flexible display device 200 may be extended in one or more directions within the plane thereof, to enlarge the display area D_A from an un-stretched state thereof.

Figure 2A:
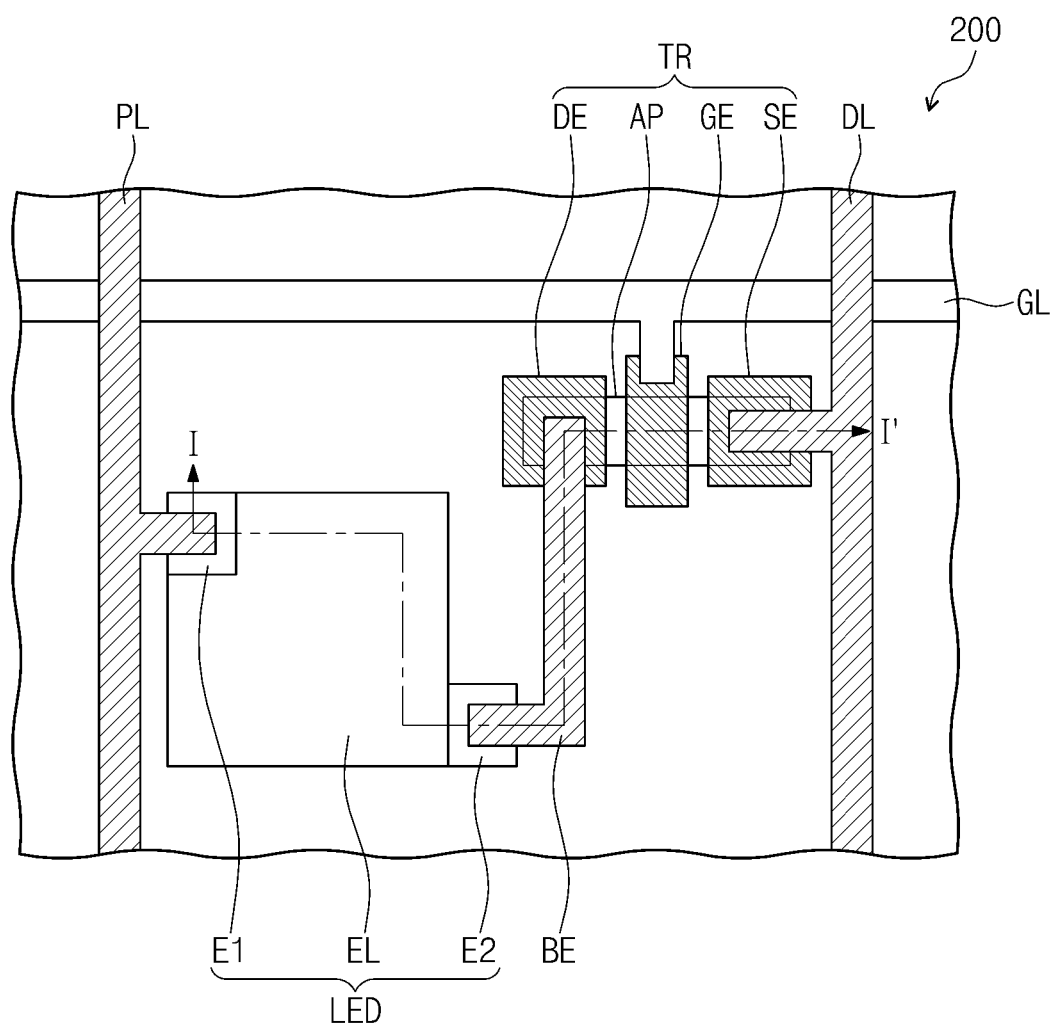
FIG. 2A is a plan view illustrating an exemplary embodiment of a pixel in the flexible display device shown in FIG. 1B.
Figure 2B:
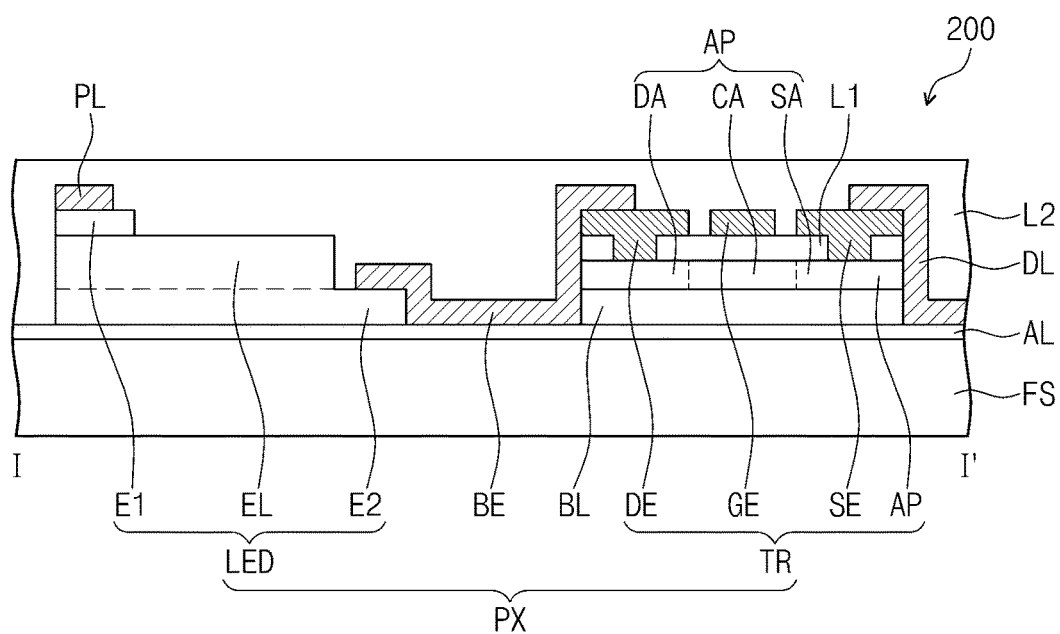
FIG. 2B is a cross-sectional view taken along I-I' shown in FIG. 2A.

FIG. 2A is a plan view illustrating an exemplary embodiment of a pixel structure within a pixel of a flexible display device shown in FIG. 1B, and FIG. 2B is a cross-sectional view taken along I-I' shown in FIG. 2A.

Referring to FIGS. 2A and 2B, while the flexible display device 200 includes a plurality of pixels defined therein, the plurality of pixels may be similar in structure and configuration. Therefore, for convenience of description, FIGS. 2A and 2B illustrates one single pixel in which a pixel structure PX is disposed among the plurality of pixels defined in the flexible display device 200.

Referring to FIGS. 2A and 2B, the flexible display device 200 may include a flexible substrate FS on which are disposed an adhesion layer AL, a pixel structure PX, a bridge electrode BE, a gate line GL, a data line DL and a power line PL.

The flexible substrate FS may have flexibility. In the exemplary embodiment, the flexible substrate FS may be stretchable within a plane thereof, so as to be stretchable within the plane of the flexible display device 200. The flexible substrate FS may include an elastomer such as polydimetylsiloxane ("PDMS").

The adhesion layer AL may be disposed on the flexible substrate FS. In more detail, the adhesion layer AL may be interposed between the pixel structure PX and the flexible substrate FS, such that the pixel structure PX is fixed on the flexible substrate FS by the adhesion layer AL.

In the illustrated exemplary embodiment, the adhesion layer AL may be disposed on a whole surface of the flexible substrate FS even though a portion thereof is illustrated for convenience of explanation.

In the embodiment, the adhesion layer AL may include a resin. In an exemplary embodiment, for example, the adhesion layer AL may include at least one of polyester resin, epoxy resin, urethane resin, acrylic resin, polyether resin and polyacrylic resin. In an exemplary embodiment, the adhesion layer AL may include a photocured material layer such as by including a photocurable material and a photopolymerization initiator.

The pixel structure PX may include a light emitting diode LED and a thin film transistor TR.

In the illustrated exemplary embodiment, the light emitting diode LED and the thin film transistor TR may be horizontally arranged on the adhesion layer AL to be arranged adjacent to each other on the adhesion layer AL. The light emitting diode LED and the thin film transistor TR arranged adjacent to each other may be spaced apart from each other to expose a portion of the adhesion layer AL. Accordingly, the light emitting diode LED and the thin film transistor TR may each contact directly with the adhesion layer AL such that the light emitting diode LED and the thin film transistor TR are fixed on the flexible substrate FS by the adhesion layer AL.

The light emitting diode LED may be electrically connected with the thin film transistor TR and the light emitting diode LED may be controlled by a switching operation of the thin film transistor TR. In the illustrated exemplary embodiment, a plurality of light emitting diode including the light emitting diodes LED may be electrically connected in one-to-one correspondence with a plurality of thin film transistors TR. Accordingly, pixels in which the pixel structures PX are disposed, which include the pluralities of light emitting diodes LED and thin film transistors TR described above, may be driven in an active matrix mode.

In the illustrated exemplary embodiment, the light emitting diode LED may include a first electrode E1, a second electrode E2, and an inorganic light emitting layer EL between the first and second electrodes E1 and E2. The first electrode E1 may be electrically connected with the power line PL. The second electrode E2 may be electrically connected with a drain electrode DE of the thin film transistor TR through the bridge electrode BE.

In the illustrated exemplary embodiment, the inorganic light emitting layer EL may include at least one of II-VI group compound semiconductors, III-V group compound semiconductors and IV-VI group compound semiconductors. As examples of the II-VI group compound semiconductors, there are CdSe, CdTe, ZnS, ZnSe and ZnTe. As examples of the III-V group compound semiconductors, there are GaN, GaP, GaAs, GaSb, InP, InAs and InSb. As examples of the IV-VI group compound semiconductors, there are PbS, PbSe and PbTe.

In another exemplary embodiment, the light emitting diode LED may further include a hole transfer layer and an electron transfer layer. The electron transfer layer may be interposed between the first electrode E1 and the inorganic light emitting layer EL to transfer electrons which are injected through the first electrode E1. The hole transfer layer may be interposed between the second electrode E2 and the inorganic light emitting layer EL to transfer holes which are injected through the second electrode E2.

The thin film transistor TR may include a buffer layer BL, a semiconductor layer AP, a gate electrode GE, a source electrode SE and the drain electrode DE. Among elements of the thin film transistor TR, a rear surface of an element of the thin film transistor TR may adhere to the adhesion layer AL such that the thin film transistor TR is fixed on the flexible substrate FS by the adhesion layer AL.

In the illustrated exemplary embodiment, the thin film transistor TR may be a top-gate type, but the invention is not limited thereto. A structure of the thin film transistor TR according to the exemplary embodiment will be described below.

The buffer layer BL may be disposed on the adhesion layer AL. The buffer layer BL may include an insulation material such as silicon oxide.

The semiconductor layer AP may be disposed on the adhesion layer AL. The semiconductor layer AP may define a source area SA thereof, a channel area CA thereof and a drain area DA thereof. A total of the semiconductor layer AP may be defined by the source, channel and drain areas SA, CA and DA. The channel area CA may be between the source area SA and the drain area DA. A concentration of dopants doped into the source area SA and the drain area DA may be higher than a concentration of dopants doped into the channel area CA.

In the illustrated embodiment, the semiconductor layer AP may include single crystalline silicon. However, the invention is not limited thereto. In another exemplary embodiment, for example, the semiconductor layer AP may include polycrystalline silicon or amorphous silicon. In still another exemplary embodiment. the semiconductor layer AP may include an oxide semiconductor or a compound semiconductor.

The semiconductor layer AP may be disposed on a first insulation layer L1 within the thin film transistor TR. The gate electrode GE may overlap the semiconductor layer AP with the first insulation layer L1 interposed therebetween. In the insulation layer L1, openings are defined in correspondence with the source area SA and the drain area DA to respectively expose the source area SA and the drain area DA.

The source electrode SE may be disposed on the first insulation layer L1 to contact with the source area SA at a first opening defined in the insulation layer L1. The drain electrode DE may be disposed on the first insulation layer L1 to contact with the drain electrode DA at a second opening defined in the insulation layer L1.

In the exemplary embodiment, the flexible display device 200 may include the bridge electrode BE. The bridge electrode BE may electrically connect the second electrode E2 of the light emitting diode LED with the drain electrode DE.

In the exemplary embodiment, the bridge electrode BE may cover a portion of the drain electrode DE and a portion of the second electrode E2 to contact with the drain electrode DE and the second electrode E2. The above-described structure of the bridge electrode BE may be defined as a result of forming the bridge electrode. In an exemplary embodiment of a method of forming a flexible display device 200, after forming the second electrode E2 of the light emitting diode LED and the drain electrode DE of the thin film transistor TR on the flexible substrate FS, the bridge electrode BE may be formed by way of an inkjet process on exposed portions of the adhesion layer AL, the second electrode E2 and the drain electrode DE. As a result, the bridge electrode BE may overlap the exposed portion of the drain electrode DE and the exposed portion of the second electrode E2 to contact with the drain electrode DE and the second electrode E2.

The gate line GL may have a length which extends along a planar direction and is electrically connected with the gate electrode GE. The gate line GL may transfer a gate signal. Additionally, the data line DL may have a length which extends along another planar direction to intersect the gate line GL and is electrically connected with the source electrode SE. The data line DL may transfer a data signal. Among layers disposed on the flexible substrate FS, the gate, source and drain electrodes GE, SE and DE are in a same layer as each other and are in different layers from those of the bridge electrode BE, the gate line GL and the data line DL.

The power line PL may have a length which extends along a planar direction to intersect the gate line GL. The power line PL is electrically connected with the first electrode E1 of the light emitting diode LED. The power line PL may transfer a power signal and/or electrical current (power). In an exemplary embodiment of forming a flexible display device, the power line PL may be formed in the same process as the data line DL, and may include the same material as the data line DL. The length of the power line PL may be parallel with that of the data line DL. Among layers disposed on the flexible substrate FS, the power line PL, the bridge electrode BE and the data line DL may be in a same layer as each other, but the invention is not limited thereto.

In the illustrated exemplary embodiment, the gate line GL, the data line DL and the power line PL may be shaped in correspondence with the stretchability of the flexible substrate FS. In more detail, for the flexible display device 200 illustrated in FIG. 2A to be extended, the gate line GL, the data line DL and the power line PL may each be shaped as elongated in straight lines in the plan view. The straight lines may be elongated in an extension direction, but the invention is not limited thereto. Where the gate line GL, the data line DL and the power line PL are shaped as elongated in straight lines in the plan view when the flexible display device 200 shrinks back to an un-stretched state thereof, the gate line GL, the data line DL and the power line DL may be shaped in waves such as in the cross-sectional and/or plan views.

A second insulation film L2 may be provided over the flexible substrate FS to cover the light emitting diode LED and the thin film transistor TR. In the illustrated exemplary embodiment, the second insulation film L2 may include a polymer such as polyimide.

FIGS. 3A to 3G illustrate an exemplary embodiment of a method of forming a thin film transistor, which is shown in FIG. 2B, on a flexible substrate. Elements described in FIGS. 3A to 3G are denoted by the same reference marks as in the previous exemplary embodiments and will not be further described in duplication.

Figure 3A:
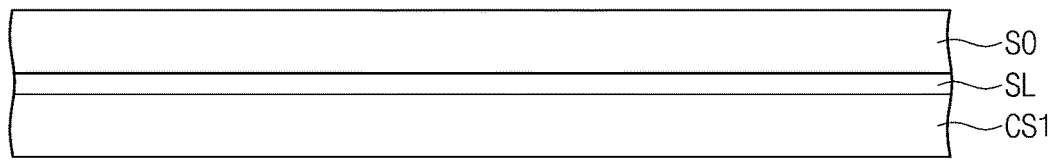
FIGS. 3A to 3G illustrate an exemplary embodiment of a method of forming a thin film transistor shown in FIG. 2B, on a flexible substrate.
Figure 3B:
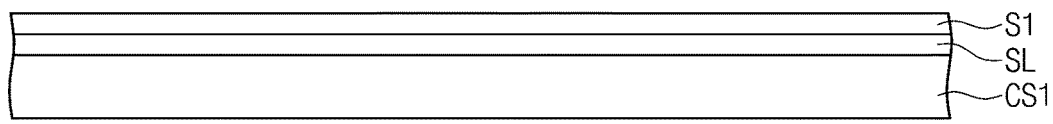

Referring to FIGS. 3A and 3B, a passivation layer SL is formed on a first carrier substrate CS1. A preparation substrate S0 may be joined to the first carrier substrate CS1 with the passivation layer SL interposed therebetween.

In the illustrated exemplary embodiment, the first carrier substrate CS1 may be a silicon wafer or a glass substrate. The preparation substrate S0 may be a silicon-on-insulator ("SOI") wafer. The passivation layer SL may include a semiconductor material such as SiGe.

An etching process may be performed on the preparation substrate S0 to form a processing substrate S1 on the passivation layer PL. The processing substrate S1 may be a substrate for which a thickness of the preparation substrate S0 is reduced such as by the etching process on the preparation substrate S0.

Figure 3C:
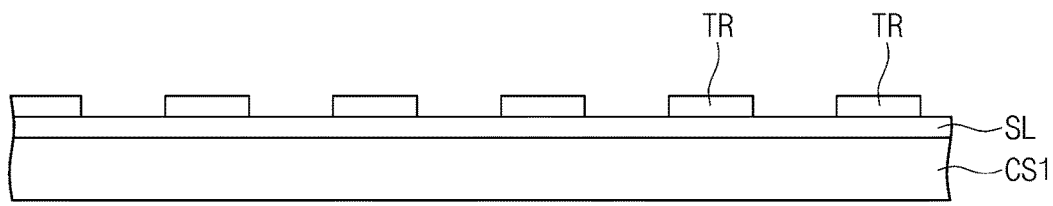

Referring to FIG. 3C, a plurality of the thin film transistors TR may be formed on the passivation layer SL by operations performed to a processing substrate (S1 of FIG. 3B). The operations may include a relatively high temperature process.

An exemplary embodiment of operations performed to a processing substrate to form the plurality of thin film transistors TR may include forming a silicon material layer on the processing substrate, injecting dopants into the silicon material layer to define a source area (SA of FIG. 2B) and a drain area (DA of FIG. 2B), annealing the processing substrate with the source drain areas thereon to form a first insulation layer (L1 of FIG. 2B), patterning the first insulation layer on the source and drain areas, forming a gate electrode (GE of FIG. 2B) from a gate electrode material layer, forming a source electrode (SE of FIG. 2B) from a source electrode material layer, forming a drain electrode (DE of FIG. 2B) from a drain electrode material layer, and scribing the processing substrate having thereon the source and drain areas, the first insulation layer and the gate, source and drain electrodes to form a plurality of individual and separate thin film transistors TR on the passivation layer SL.

Figure 3D:
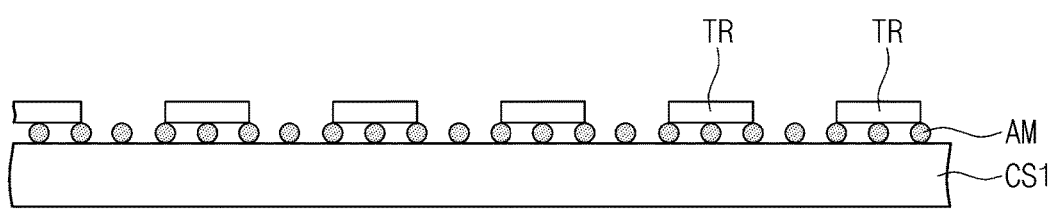

Referring to FIG. 3D, after forming the plurality of thin film transistors TR on the passivation layer SL, an etchant may be provided to the passivation layer (SL of FIG. 3C) having the plurality of individual and separate thin film transistors TR thereon, to process the passivation layer. As a result, after processing the passivation layer, an adhesive material AM, which is a byproduct of processing the passivation layer, may be interposed between the first carrier substrate CS1 and each of the plurality of thin film transistors TR.

If each of the plurality of thin film transistors TR and the first carrier substrate CS1 are coupled to each other through the passivation layer by a first bonding force, and each of the plurality of thin film transistors TR and the first carrier substrate CS1 are coupled to each other through the adhesive material AM by a second bonding force, the second bonding force may be smaller than the first bonding force. As the passivation layer is processed and effectively replaced with the byproduct adhesive material AM, a bonding force between each of the plurality of thin film transistors TR and the first carrier substrate CS1 may be remarkably weakened.

Figure 3E:
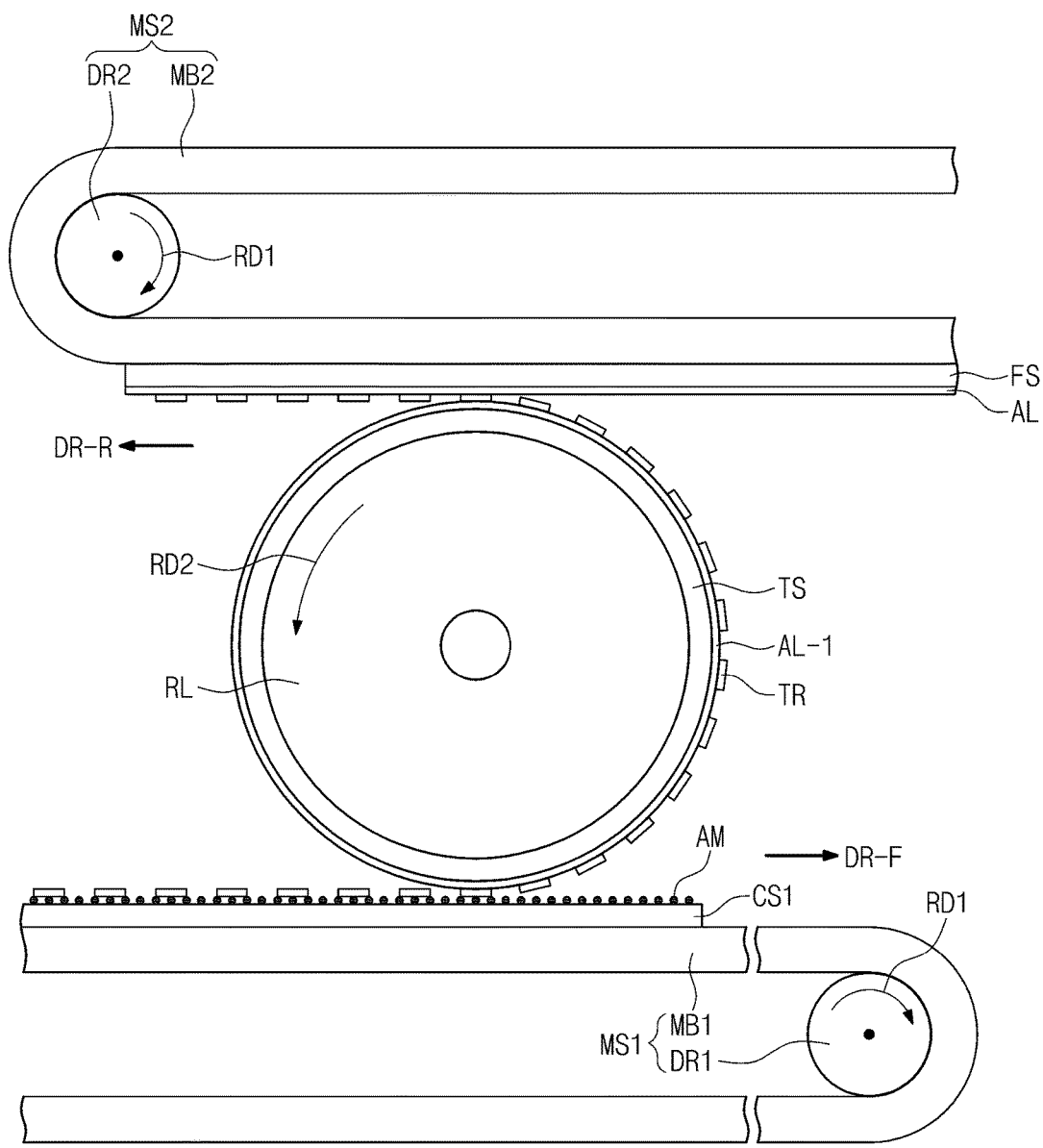

Referring to FIG. 3E, a compression roller RL may be disposed between a first moving system MS1 and a second moving system MS2. In the illustrated exemplary embodiment, the first moving system MS1 may include a first driving roller DR1 and a first moving belt MB1 which is coupled with the first driving roller DR1, while the second moving system MS2 may include a second driving roller DR2 and a second moving belt MB2 which is coupled with the second driving roller DR2.

An adhesion member AL-1 may be disposed on a surface of a transcription substrate TS. The transcription substrate TS with the adhesion member AL-1 thereon may be adhered to the surface of the compression roller RL. In the illustrated exemplary embodiment, the adhesion member AL-1 may be an adhesive resin such as epoxy resin or urethane resin, or an adhesive member provided in a form of film.

The first carrier substrate CS1 including the plurality of thin film transistors TR thereon is disposed on the first moving belt MB1. A flexible substrate FS including an adhesion layer AL thereon may be disposed on the second moving belt MB2.

Then, the compression roller RL, and the first and second moving systems MS1 and MS2 having the above-described components thereon, may be driven. In more detail, the first driving roller DR1 may rotate in a first rotation direction RD1 to drive the first moving belt MB1 and the compression roller RL may rotate in a second rotation direction RD2 which is the reverse of the first rotation direction RD1, at a same time. Additionally, the second driving roller DR2 may rotate in the first rotation direction RD1 to drive the second moving belt MB2 at a same time the first moving belt MB1 is driven and the compression roller RL is rotated.

As a result, the first carrier substrate CS1 on the first moving belt MB1 may progress in a forward direction DR-F and the flexible substrate FS on the second moving belt MB2 may progress in a rearward direction DR_R. While the first and second moving belts MB1 and MB2 are being driven, the compression roller RL may transfer the plurality of thin film transistors TR disposed on the first carrier substrate CS1 to the compression roller RL. Accordingly, the plurality of thin film transistors TR may be transferred to the transcription substrate TS from the first carrier substrate CS1 by the compression roller RL.

In the illustrated exemplary embodiment, a first adhesion force of the adhesion member AL-1 to adhere the plurality of thin film transistors TR to the transcription substrate TS may be larger than a second adhesion force of an adhesive material AM to adhere the plurality of thin film transistors TR to the first carrier substrate CS1. Accordingly, while the compression roller RL is removing the plurality of thin film transistors TR from the first carrier substrate CS1, the adhesion member AL_1 may supply a force to easily transfer the plurality of thin film transistors TR to the transcription substrate TS.

With the plurality of thin film transistors TR on the transcription substrate TS, the compression roller RL may further transfer the plurality of thin film transistors TR to the flexible substrate FS including the adhesion layer AL thereon. As a result, the plurality of thin film transistors TR, which have initially been transferred to the transcription substrate TS, may be further transferred onto the flexible substrate FS.

In the illustrated embodiment, a third adhesion force of the adhesion layer AL to adhere the plurality of thin film transistors TR to the flexible substrate FS may be larger than the first adhesion force of the adhesion member AL-1 to adhere the plurality of thin film transistors TR to the transcription substrate TS. Accordingly, when the compression roller RL is contacting the plurality of thin film transistors TR to the adhesion layer AL, the plurality of thin film transistors TR may be easily transferred to the flexible substrate FS.

Figure 3F:
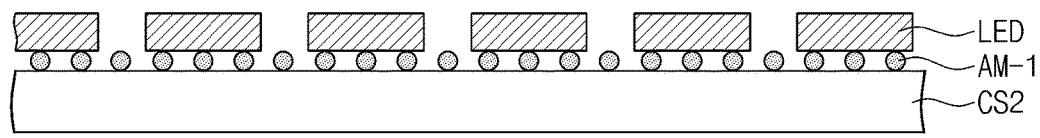

Referring to FIG. 3F, a plurality of light emitting diodes LED may be fabricated on a second carrier substrate S2.

In the illustrated exemplary embodiment, similar to the aforementioned operations described with reference to FIGS. 3A to 3D, the plurality of light emitting diodes LED may be fabricated by operations including forming a passivation layer on a second carrier substrate CS2, combining the second carrier substrate CS2 with a processing substrate (not shown) while interposing the passivation layer therebetween forming the plurality of light emitting diodes including an inorganic light emitting layer on and/or from the processing substrate combined with the second carrier substrate CS2. The operations for forming the plurality of light emitting diodes LED may include a relatively high temperature process. Additionally, after fabricating the plurality of light emitting diodes LED, the passivation layer may be etched to interpose an adhesive material AM_1 between the plurality of light emitting diodes LED and the second carrier substrate CS2.

Figure 3G:
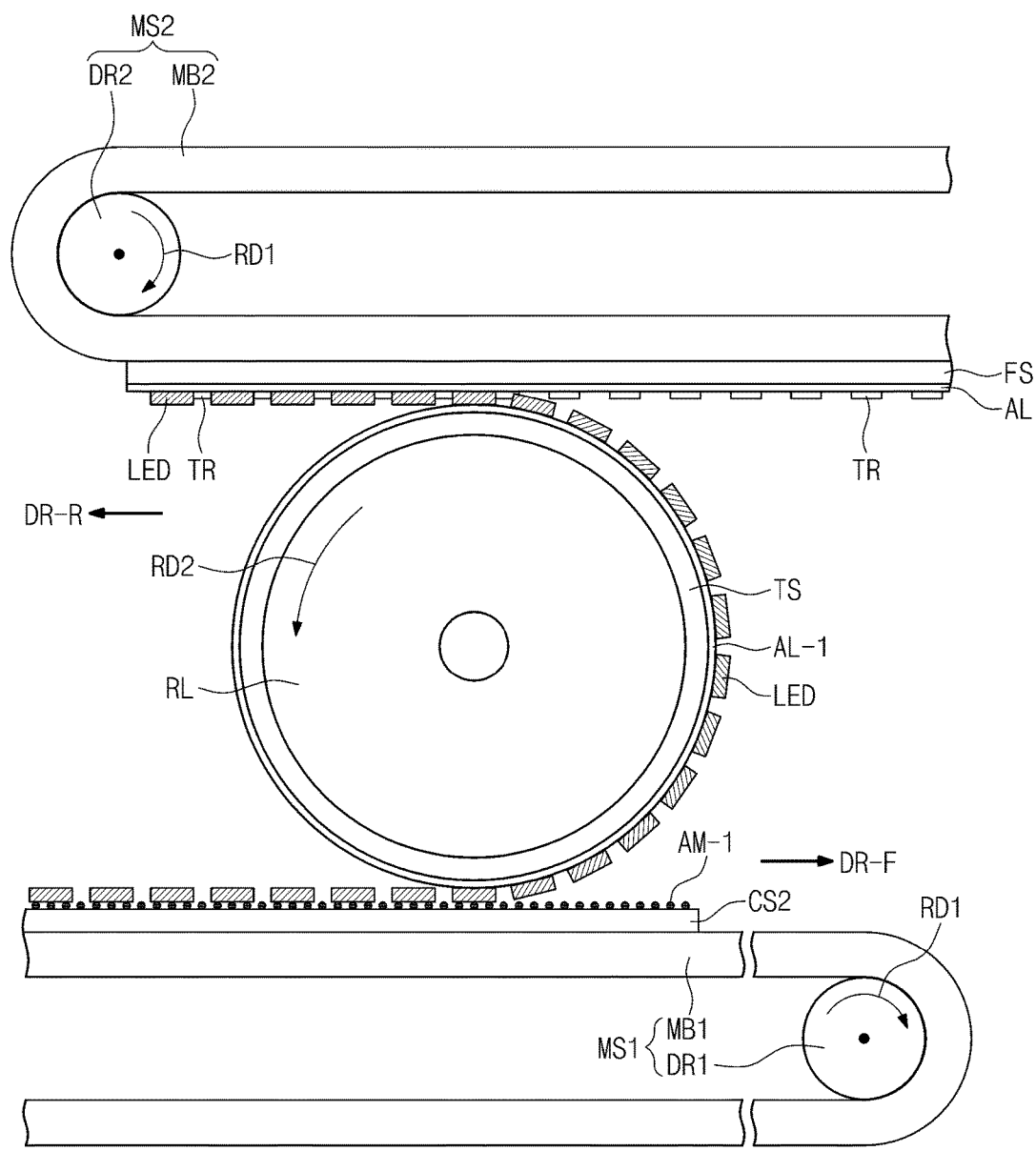

Referring to FIG. 3G, a second carrier substrate CS2 including the plurality of light emitting diodes LED thereon may be disposed on the first moving belt MB1, and the flexible substrate including the plurality of the transferred thin film transistors TR thereon may be disposed on the second moving belt MB2.

Similar to the aforementioned description with respect to FIG. 3E, the compression roller RL, and the first and second moving systems MS1 and MS2 may be driven. As a result, the second carrier substrate CS2 on the first moving belt MB1 may progress in the forward direction DR-F and the flexible substrate FS on the second moving belt MB2 may progress in the rearward direction DR-R.

Additionally, while the first and second moving belts MB1 and MB2 are being driven, the compression roller RL may transfer the light emitting diodes LED from the second carrier substrate CS2 to the transcription substrate TS with the adhesion member AL-1 thereon. Accordingly, the plurality of light emitting diodes LED may be transferred to the transcription substrate TS by the compression roller RL.

In the illustrated exemplary embodiment, a fourth adhesion force of the adhesion member AL-1 to adhere the plurality of light emitting diodes LED to the transcription substrate TS may be larger than a fifth adhesion force of the adhesive material AM-1 to adhere the plurality of light emitting diodes LED to the second carrier substrate CS2. Accordingly, when the compressive roller RL is removing the plurality of light emitting diodes LED from the second carrier substrate CS2, the plurality of light emitting diodes LED may be easily transferred to the transcription substrate TS.

After the plurality of light emitting diodes LED is transferred to the transcription substrate TS, the compressive roller RL may further transfer the plurality of light emitting diodes LED to the flexible substrate FS including the adhesion layer AL and the plurality of thin film transistors TR thereon. As a result, the plurality of light emitting diodes LED initially transferred to the transcription substrate TS may be further transferred to the flexible substrate FS.

In the illustrated exemplary embodiment, a sixth adhesion force of the adhesion layer AL to adhere the plurality of light emitting diodes LED to the flexible substrate FS may be larger than the fourth adhesion force to adhere the plurality of light emitting diodes LED to the transcription substrate TS. Accordingly, when the compressive roller RL is contacting the plurality of light emitting diodes LED to the adhesion layer AL, the plurality of light emitting diodes LED may be easily transferred to the flexible substrate FS.

The plurality of thin film transistors TR transferred onto the flexible substrate FS are spaced apart from each other. The later-transferred plurality of light emitting diodes LED is disposed at the spaces defined between adjacent thin film transistors TR. While it is described that the plurality of thin film transistors TR is firstly transferred to the flexible substrate FS, the invention is not limited thereto and alternatively, the plurality of light emitting diodes LED may be first transferred to the flexible substrate FS.

Figure 4A:
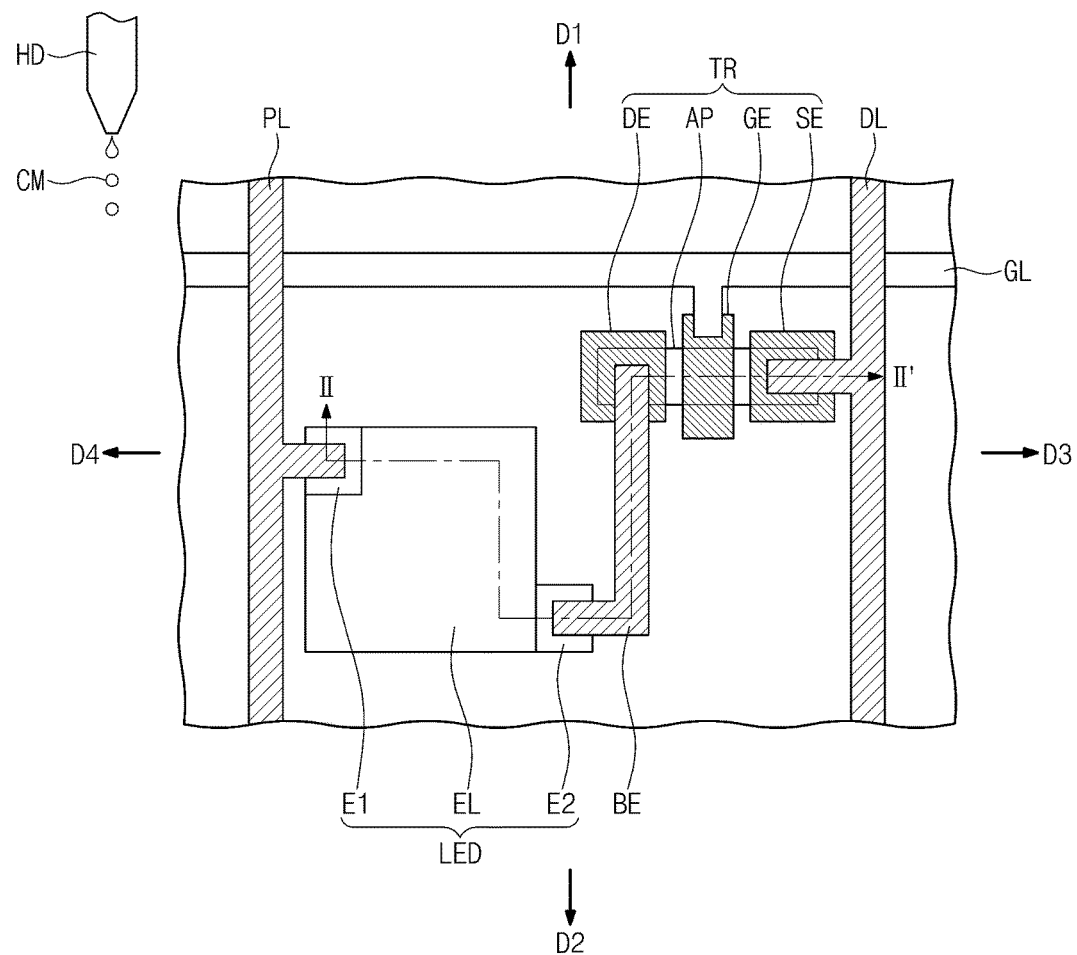
FIG. 4A illustrates an exemplary embodiment of a method of forming connection electrodes and signal lines to connect a thin film transistor and a light emitting diode to each other, which have been transferred into a flexible substrate.
Figure 4B:
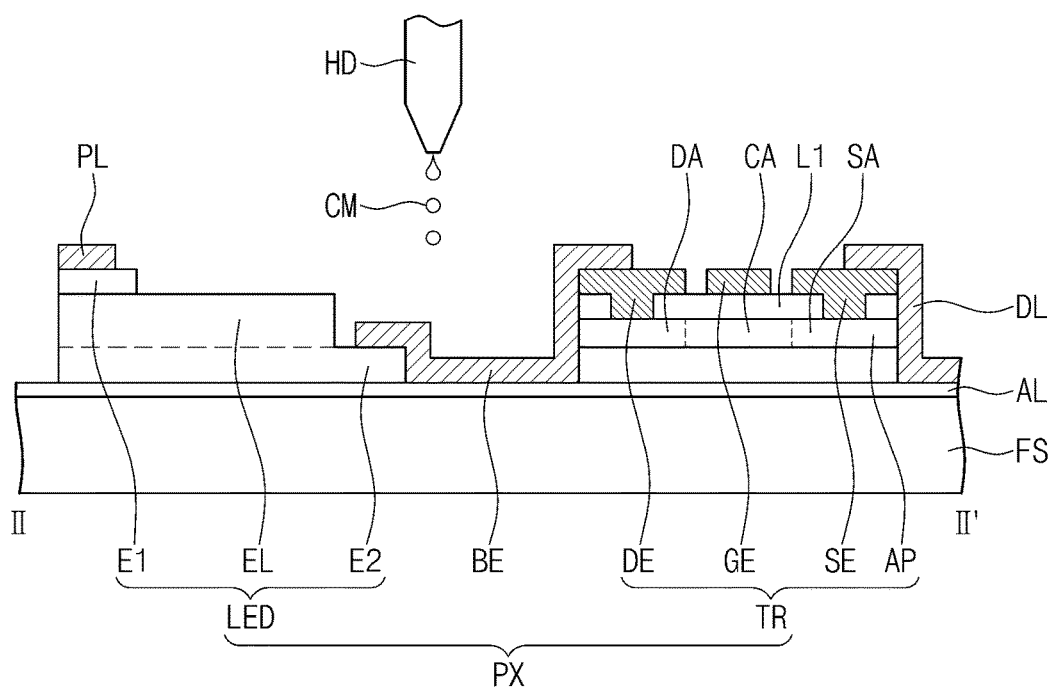
FIG. 4B is a cross-sectional view taken along II-II' shown in FIG. 4A.

FIG. 4A illustrates an exemplary embodiment of a method of forming connection electrodes and signal lines to connect a thin film transistor and a light emitting diode to each other, which have been transferred to a flexible substrate, and FIG. 4B is a sectional view taken along II-II' shown in FIG. 4B.

Referring to FIGS. 4A and 4B, a gate line GL may be formed on a flexible substrate FS including a transferred light emitting diode LED and a transferred thin film transistor TR thereon. The formed gate line GL may contact with a gate electrode GE of the previously transferred thin film transistor TR.

In the illustrated exemplary embodiment, the gate line GL may be formed by an inkjet process. In more detail, the gate line GL and the gate electrode GE may be formed by providing a conductive ink CM to the flexible substrate FS including a transferred light emitting diode LED and a transferred thin film transistor TR thereon, such as through a head HD of a dispensing unit and then hardening the provided conductive ink CM.

In the illustrated exemplary embodiment, the gate line GL may be formed while the flexible substrate FS is extended toward first to fourth directions D1, D2, D3 and D4 (e.g., a stretched state thereof) from an un-stretched state thereof. FIG. 4A illustrates stretching in the first to fourth directions D1, D2, D3 and D4 by arrows indicated for each of the first to fourth directions D1, D2, D3 and D4. The gate line GL may be formed while the flexible substrate FS having the transferred light emitting diode LED and the transferred thin film transistor TR thereon is extended toward first to fourth directions D1, D2, D3 and D4. Accordingly, as shown in FIG. 4A, the gate line GL may be shaped in a straight line while the flexible substrate FS is extended in an extension direction to be disposed in the stretched state thereof. From the stretched state thereof, when the flexible substrate FS is shrunk (e.g., un-stretched) in reverse directions to the first to fourth directions D1, D2, D3 and D4, the flexible substrate FS including the variously formed elements thereon may be shaped in a wave such as in the cross-sectional and/or plan views.

An insulation layer (not shown) may be formed on the gate line GL and the gate electrode GE. The insulation layer may be formed while the flexible substrate FS including the gate line GL and the gate electrode GE thereon is in an un-stretched or stretched state thereof. A data line DL and a power line PL may be formed on the flexible substrate FS including the insulation layer on the gate line GL and the gate electrode GE. The data line DL and the power line PL may have lengths with intersect that of the gate line GL while being insulated from the gate line GL through the insulation layer.

In the illustrated exemplary embodiment, as the same manner for forming the gate line GL described above, the data line DL and the power line PL may be formed in an inkjet process. The data line DL may contact with a source electrode SE of the previously transferred thin film transistor TR and the power line PL may contact with the first electrode E1 of the previously transferred light emitting diode LED.

Referring to FIG. 4B, a bridge electrode BE may be formed in an inkjet process as the same manner for the data line DL and the power line PL. During this, the head HD may dispenses a conductive ink CM while shifting from a position in which the drain electrode DE is formed toward a position of a second electrode E2 of the previously transferred light emitting diode LED. As a result, the bridge electrode BE may cover a portion of the drain electrode DE and a portion of the second electrode E2, and at the same time, the bridge electrode BE may contact with the drain electrode DE and the second electrode E2.

A second insulation layer (L2 of FIG. 2B) may be formed to cover the flexible substrate FS including the power line PL, the bridge electrode BE, the data line DL, the thin film transistor TR and the light emitting diode LED thereon, thereby completing a flexible display device.

While the invention has been described with reference to exemplary embodiments, it will be apparent to those skilled in the art that various changes and modifications may be made without departing from the spirit and scope of the invention set forth throughout the annexed claim matters. Therefore, it should be understood that the above exemplary embodiments are not limiting, but illustrative, hence all technical things within the annexed claims and the equivalents thereof may be construed as properly belonging to the territory of the invention.

What is claimed is:

1. A method of manufacturing a flexible display device, the method comprising:
forming a thin film transistor including electrodes, on a first carrier substrate;
forming a light emitting diode on a second carrier substrate;
transferring the thin film transistor on the first carrier substrate, from the first carrier substrate to a surface of flexible substrate; and
transferring the light emitting diode on the second carrier substrate, from the second carrier substrate to the surface of the flexible substrate,
wherein the flexible display device comprises both the transferred thin film transistor and the transferred light emitting diode on the surface of the flexible substrate.

2. The method of claim 1, wherein the transferring of the thin film transistor to the flexible substrate comprises:
transferring the thin film transistor on the first carrier substrate, from the first carrier substrate to a roller; and
transferring the thin film transistor on the roller, from the roller to the surface of the flexible substrate.

3. The method of claim 1, wherein the transferring of the light emitting diode to the flexible substrate comprises:
transferring the light emitting diode on the second carrier substrate, from the second carrier substrate to a roller; and
transferring the light emitting diode on the roller, from the roller to the surface of the flexible substrate.

4. The method of claim 1, further comprising:
after transferring the thin film transistor and the light emitting diode to the surface of the flexible substrate, forming a bridge electrode on the flexible substrate including the transferred thin film transistor and the transferred light emitting diode thereon, wherein the bridge electrode connects a drain electrode of the thin film transistor with a first electrode of the light emitting diode.

5. The method of claim 4, further comprising:
forming on the flexible substrate including the transferred thin film transistor, the transferred light emitting diode and the bridge electrode thereon:
- a power line connected with a second electrode of the light emitting diode;
- a gate line connected with a gate electrode of the thin film transistor; and
- a data line connected with a source electrode of the thin film transistor.

6. The method of claim 5, wherein at least one of the bridge electrode, the gate line, the data line and the power line is formed on the flexible substrate including the transferred thin film transistor and the transferred light emitting diode thereon by an inkjet process.

7. The method of claim 5, wherein
the gate line, the data line and the power line are formed while the flexible substrate is stretched.

8. The method of claim 1, wherein the flexible substrate has stretchability.

9. The method of claim 1, further comprising forming an adhesion layer on an entirety of the surface of the flexible substrate to which the thin film transistor and the light emitting diode are transferred.

10. The method of claim 9, wherein the light emitting diode and the thin film transistor transferred to the surface of the flexible substrate are disposed adjacent to each other on the adhesion layer.

11. The method of claim 1, wherein the forming of the light emitting diode on the second carrier substrate comprises stacking an inorganic light emitting layer on the second carrier substrate.

12. The method of claim 1, wherein the forming of the thin film transistor on the first carrier substrate comprises:
- forming a passivation layer on the first carrier substrate;
- forming a processing substrate including electrode material layers on the passivation layer;
- processing the processing substrate on the passivation layer to form the thin film transistor including the electrodes on the passivation layer; and
- processing the passivation layer between the thin film transistor on the passivation layer and the first carrier substrate to weaken an adhesion force between the thin film transistor and the first carrier substrate.

* * * * *